United States Patent [19]

Kasperkovitz et al.

[11] Patent Number: 4,625,131

[45] Date of Patent: Nov. 25, 1986

[54] ATTENUATOR CIRCUIT

[75] Inventors: Wolfdietrich G. Kasperkovitz; Dirk J. Dullemond, both of Eindhoven, Netherlands

[73] Assignee: U.S. Philips Corporation, New York, N.Y.

[21] Appl. No.: 590,095

[22] Filed: Mar. 16, 1984

[30] Foreign Application Priority Data

Mar. 31, 1983 [NL] Netherlands .................. 8301139

[51] Int. Cl.$^4$ .............................................. H03K 5/08
[52] U.S. Cl. .................................. 307/540; 307/264; 307/362; 307/494; 307/555
[58] Field of Search ............... 307/362, 264, 494, 552, 307/555, 567, 540

[56] References Cited

U.S. PATENT DOCUMENTS 3,522,443  8/1970  Kanter ............................... 307/567
3,778,646 12/1973  Masaki ............................. 307/264

Primary Examiner—John Zazworsky
Attorney, Agent, or Firm—Thomas A. Briody; Jack Oisher; William J. Streeter

[57] ABSTRACT

A frequency-to-phase converter comprises an attenuator circuit (1), a delay circuit (2) and a comparator (3). The attenuator circuit (1) is provided with two transistors ($T_1$, $T_2$), which are arranged as a differential pair and whose collectors (9, 10) are coupled to the positive supply-voltage terminal (5). A voltage divider ($R_x$, $R_y$) with a tap (11) is arranged between the collectors (9, 10). If a signal is applied to the input terminal (4), the attenuated signal is available on the tap (11) and the unattenuated signal is available on the collector (9). The attenuated signal is applied to input (20) through an emitter-follower ($T_4$) and the unattenuated signal is applied to input (21) of the comparator (3) through an emitter-follower ($T_3$) and a delay circuit (2). A signal, whose different frequencies are delayed by the same time over a wide frequency range appears on the output (22).

5 Claims, 2 Drawing Figures

ATTENUATOR CIRCUIT

The invention relates to an attenuator circuit for attenuating an electric signal.

Such an attenuator circuit may be used in a frequency-to-phase converter of the type disclosed in U.S. Pat. No. 3,763,436. In such a converter a pulse-shaped input signal is applied to one input of a comparator through a delay circuit and to the other input of said comparator through an attenuator circuit. On the output of the comparator a pulse-shaped output signal appears, whose pulses have all been subjected to exactly equal time delays. The attenuator circuit in the known circuit is a resistive voltage divider. In order to preclude harmonic distortion when such a frequency-to-phase converter is used in, for example, a demodulation device of a single-chip integrated FM-receiver as described in Electronics, Jan. 27, pages 129-130, the relationship between the frequency and phase must be substantially linear in the phase range from 0° to 180°. This relationship is found to be highly linear for very small levels of the input signal. Therefore, the attenuator circuit should provide a very accurate attenuation of the input signal.

In such circuits the input signal is generally applied with a d.c. level different from zero, so that the use of a voltage divider results in a difference between the d.c. level of the attenuated signal and the d.c. level of the signal applied to the delay circuit. It is desirable to maintain these levels equal, which may be achieved by the use of a level-shifting circuit or, as is described in said United States Patent Specification, by applying the input signal to the attenuator circuit and the delay circuit through blocking capacitors. However, the blocking capacitor cannot be integrated. This renders the known attenuator circuit less suitable for integration in a fully integrated FM receiver, whose numbers of connection pins and external components have been minimized in order to minimize the dimensions.

SUMMARY OF THE INVENTION

It is an object of the invention to provide an attenuator circuit which provides an accurate attenuation, the d.c. level of the attenuated signal being substantially equal to that of the unattenuated signal. It is another object of the invention to provide an attenuator circuit which can be integrated completely.

To this end an attenuator circuit is characterized in that it comprises a first and a second transistor, which each have a control terminal, a first main terminal and a second main terminal. The first main terminals have a common connection which is coupled to a first supply-voltage terminal through a current source. The second main terminals are each coupled to a second supply-voltage terminal through a respective load, two ends of a voltage divider being coupled to the second main terminals, which divider comprises a tap for taking off a signal which is attenuated relative to a signal appearing on one of the ends of the voltage divider. The control terminal, the first main terminal and the second main terminal are defined herein as the base electrode, emitter electrode and collector electrode respectively in case of bipolar transistors and as the gate-electrode, source electrode and drain electrode respectively in case of field-effect transistors. In the case of a circuit equipped with bipolar transistors the signal to be processed is applied to, for example, the base of one transistor of the differential amplifier, the unattenuated signal being taken from one of the collectors and the attenuated signal from said voltage divider. The d.c. level of the attenuated signal is substantially equal to that of the unattenuated signal, because in the absence of a signal on the inputs of the differential amplifier no quiescent current flows in the voltage divider, so that the voltage on the collectors of the differential amplifier is equal to the voltage on the tap of the voltage divider. The load resistors of the differential amplifier and the resistors of the voltage divider can be integrated within a very small area and can thus be fabricated with a comparatively high accuracy, so that a very accurate voltage divider can be obtained.

An attenuator circuit in accordance with the invention may be further characterised in that one of the second main terminals and the tap of the voltage divider are coupled to the control electrodes of a third and a fourth transistor respectively, which transistors are arranged as emitter followers. The attenuated and unattenuated signals are then available on low-impedance points, which may be coupled to further stages of the circuit.

Current sources may be arranged in the emitter lines of the third and the fourth transistor the ratio between the currents supplied by said sources being such that the d.c. level on the tap for the attenuated signal is substantially equal to the d.c. level on the second main terminal which carries the unattenuated signal. The base currents of the third and fourth transistors influence the d.c. levels of the attenuated signal and the unattenuated signal. By a suitable choice of the currents supplied by the current sources in the emitter lines of the third and the fourth transistors, the d.c. level on the base of the third transistor can be made equal to that on the base of the fourth transistor.

The ratio between the emitter areas of the third and the fourth transistor may be substantially equal to the ratio between the currents in the emitter lines of the third and the fourth transistor. This step ensures that the base-emitter voltages of the third and the fourth transistor are equal, so that the d.c. levels of the attenuated signal and the unattenuated signal on the emitters of the third and fourth transistor are equal.

As an alternative a resistor may be arranged in at least one of the base lines of the third and the fourth transistor, which resistor has such a value that the d.c. level on the emitter of the third transistor is substantially equal to the d.c. level on the emitter of the fourth transistor. In this case the d.c. levels on the emitters of the third and the fourth transistor are not made equal by means of the currents from the current sources in the emitter lines of the third and the fourth transistors but by means of a resistor in at least one of the base lines. The currents supplied by the current sources in the emitter lines may then be equal or unequal. Moreover, the emitter area of the third and the fourth transistor may be equal or unequal.

DESCRIPTION OF THE FIGURES

The invention will now be described in more detail, by way of example, with reference to the accompanying drawing, in which.

DESCRIPTION OF THE PREFERRED EMBODIMENT

Figure 1:
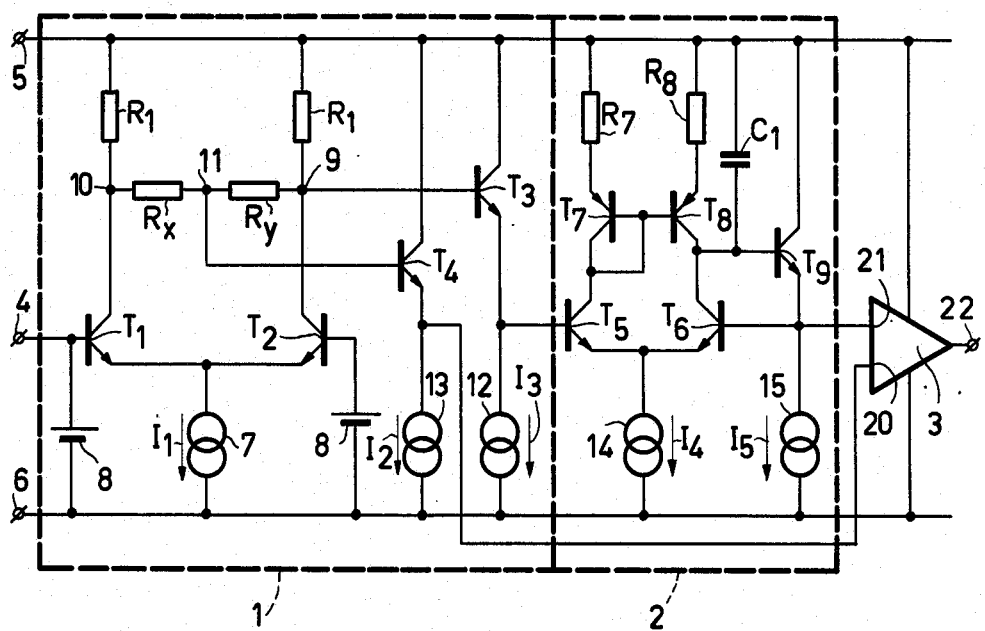
FIG. 1 shows a frequency-to-phase converter equipped with an attenuator circuit in accordance with the invention.

FIG. 1 shows a frequency-to-phase converter which is equipped with an attenuator circuit 1 in accordance with the invention, a delay circuit 2 and a comparator 3. The attenuator circuit 1 comprises two transistors $T_1$ and $T_2$ which are connected as a differential pair, whose collectors are each connected to the positive supply-voltage terminal 5 by a respective resistor $R_1$, and whose common emitter connection is connected to the earth terminal 6 by a current source 7 supplying a current of the value $I_1$. In the present Application a current source is to be understood to mean a current-supply element having a high impedance. It is obvious that instead of resistors $R_1$ current sources, diodes etc. may be used as collector loads. The base of transistor $T_1$ is connected to the input terminal 4 and by means of a reference-voltage source 8 to the earth terminal 6. The base of transistor $T_2$ is also connected to the earth terminal 6 by means of a reference-voltage source 8. Between the collectors 9 and 10 of the transistors $T_1$ and $T_2$ a voltage divider is arranged, which comprises the resistors $R_x$ and $R_y$. It is obvious that further circuit elements, such as emitter followers, may be arranged between the ends of the voltage divider and the collectors. These resistors have resistance values $R_x = R_2(1+a)$ and $R_y = R_2(1-a)$ respectively, a being a constant with a value $0 \leq a < 1$, $R_2$ being a constant. The collector 9 of transistor $T_2$ is connected to the base of an emitter-follower transistor $T_3$, a current source 12 supplying a current $I_3$ being arranged in the emitter line. Similarly, the tap 11 of the voltage divider $R_x$, $R_y$ is connected to the base of an emitter-follower transistor $T_4$, a current source 13 applying a current $I_2$ being arranged in the emitter line.

If no input signal appears on terminal 4 the current $I_1$ is divided uniformly between the transistors $T_1$ and $T_2$, so that the voltage produced on points 9 and 10 by these currents are equal. The base current of transistor $T_4$ on point 11 is divided between the resistors $R_1$, $R_x$ and $R_y$, $R_1$ and the base current of transistor $T_3$ on point 9 is divided between the resistors $R_1$ and $R_y$, $R_x$ and $R_1$. In order to ensure that these base currents do not cause a voltage difference between points 9 and 11 these base currents must have specific values. In the case of equal current-gain factors of the transistors $T_3$ and $T_4$ a simple calculation will show that the ratio between the currents from the current sources 12 and 13 should comply with:

$$\frac{I_3}{I_2} = 1 + \frac{R_2}{R_1}(1+a).$$

Moreover, the base-emitter voltage of the transistors $T_3$ and $T_4$ must be equal to each other to ensure that the d.c. level on the emitter of transistor $T_3$ is accurately equal to that on the emitter of transistor $T_4$. For this purpose the emitter areas $A_3$ and $A_4$ of the transistors $T_3$ and $T_4$ must be selected so that:

$$I_2/I_3 = A_4/A_3$$

In another embodiment, not shown, the currents may be selected so that $I_2 = I_3$ and the emitter areas may be selected so that $A_3 = A_4$. The resulting voltage difference between points 9 and 11 is then compensated for by arranging a resistor in the base line of transistor $T_4$, so that the d.c. level on the base of transistor $T_3$ is again equal to that on the base of transistor $T_4$. Alternatively, the currents $I_2$ and $I_3$ and the emitter areas $A_3$ and $A_4$ may be selected to be unequal. Equal voltages on the emitters of the transistors $T_3$ and $T_4$ can then be obtained by arranging a resistor both in the base line of transistor $T_3$ and that of transistor $T_4$.

Figure 2:
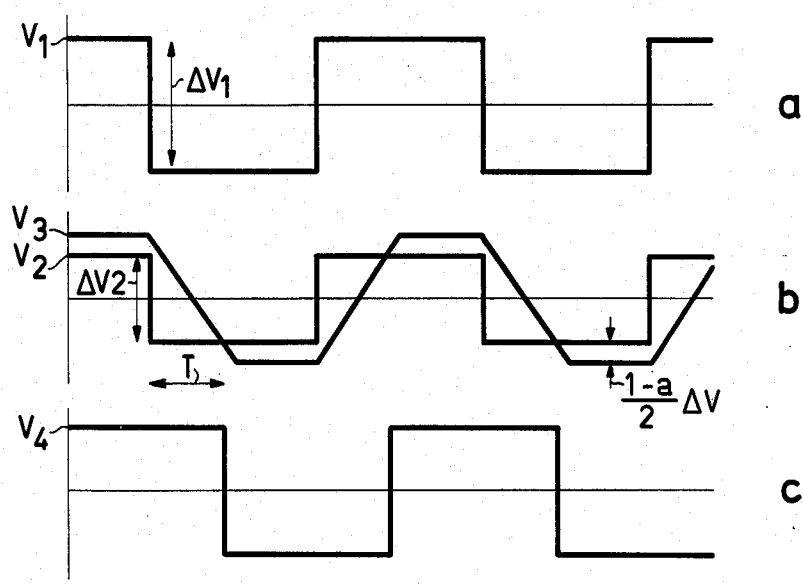
FIG. 2 shows some signal waveform appearing in the circuit shown in FIG. 1.

By applying a pulse-shaped signal, for example, a frequency-modulated signal, to the input terminal 4 transistors $T_1$ and $T_2$ are alternately turned on and turned off, so that the polarity of the voltage difference between the collectors 9 and 10 changes each time. The amplified input signal appears on collector 9 of transistors $T_2$ and consequently on the emitter of transistor $T_3$. FIG. 2a shows the signal $V_1$ of the pulse height $\Delta V_1$ on the emitter of transistor $T_3$. The attenuated signal is taken from tap 11. As a result of the inequality of the resistors $R_y = R_2(1-a)$ and $R_x = R_2(1+a)$, the signal voltage on tap 11 follows the polarity of the voltage difference $\Delta V_1$ between the collectors 9 and 10. The signal voltage $V_2$ on the tap 11 and hence on the emitter of transistor $T_4$ has a pulse height $$\Delta V_2 = \frac{(1+a)}{2} \Delta V_1.$$

FIG. 2b shows this voltage $V_2$. In order to obtain a substantially linear frequency-to-phase characteristic a low attenuation of the signal on the collector 9 of transistor $T_2$ is required. This low attenuation is obtained when the factor a is large, which factor has a value of approximately 0.8 to 0.9 in practice. Therefore, the resistors $R_x$ and $R_y$ and the resistors $R_1$ should have a very high relative accuracy in view of the offset compensation. Since in an integrated circuit these resistors can be arranged close to each other within a small area, these resistors can be fabricated with a minimal spread.

It is to be noted that the pulse-shaped input signal may be applied to the base of $T_2$ instead of to the base of $T_1$, the signals on the collector 9 and the tap 11 then being inverted. Alternatively, the positive pulse half may be applied to the base of $T_1$ and the negative pulse half to the base of $T_2$.

The signal on the emitter of transistor $T_3$ is applied to the base of transistor $T_5$, which forms part of a delay circuit 2, the attenuated signal on the emitter of transistor $T_4$ being applied to the first input 20 of the comparator 3.

The delay circuit 2, of which a simple version is shown for the sake of clarity, comprises two transistors $T_5$ and $T_6$ which are arranged as a differential pair and whose common emitter connection is coupled to the earth terminal 6 by means of a current source 14 supplying a current $I_4$. The differential pair $T_5$, $T_6$ is loaded by a current mirror, which in the present embodiment comprises a transistor $T_7$, arranged as a diode, and a transistor $T_8$, which transistors have common connected bases. The emitters of the transistors $T_7$ and $T_8$ are coupled to the positive supply-voltage terminal 5 by resistors $R_7$ and $R_8$ respectively. A capacitor $C_1$ is coupled to the output and in the present example it is connected to the positive supply-voltage terminal 5. The capacitor $C_1$ is added externally to the integrated circuit. Moreover, the output is connected to the base of an emitter-follower transistor $T_9$, a current source 15 supplying a current $I_5$ being arranged in the emitter line. The emitter of transistor $T_9$ is coupled to the base of transistor $T_6$ and to the input 21 of the comparator 3. The ratio between resistors $R_7$ and $R_8$ is selected so that the collector currents of the transistors $T_5$ and $T_6$ are substantially equal to each other.

In the absence of an input signal on the base of transistor $T_5$, capacitor $C_1$ is charged so far that the d.c. level on the base of transistor $T_6$ is equal to that of transistor $T_5$. Consequently, the d.c. levels on the inputs 20 and 21 are also equal, so that no signal appears on output 22 of the comparator 3.

If the pulse-shaped input signal $V_1$ appears on the base of transistor $T_5$ transistors $T_5$ and $T_6$ conduct alternately, so that capacitor $C_1$ is charged and discharged respectively. Capacitor $C_1$ is charged until the voltage across the capacitor and through emitter follower $T_9$, the voltage on the base of transistor $T_6$ is equal to the maximum value of the voltage $V_1$ on the base of transistor $T_5$. Similarly, during discharging the voltage on the base of transistor $T_6$ decreases until it is equal to the minimum value of the voltage $V_1$ on the base of transistor $T_5$. In FIG. 2b $V_3$ represents the voltage variation on the emitter of transistor $T_9$ and hence on input 21 of the comparator 3. The voltages $V_2$ and $V_3$ shown in FIG. 2b are the input voltages of the comparator 3. The comparator 3 compares these voltages and the voltage level on the output 22 of comparator 3 changes each time that the polarity of the voltage difference changes. FIG. 2c shows the variation of this voltage $V_4$. The pulses on the output 22 have all been delayed by substantially the same time T for a wide frequency range, so that a substantially linear relationship is obtained between the frequency and phase in the range from 0° to 180°. The frequency for which the output signal lags the phase of the input signal by 90° is called the characteristic frequency $f_0$. The time $t_0$ corresponding to this frequency $f_0$ is equal to the time necessary for the capacitor $C_1$ to be charged by such an amount that the voltage variation across the capacitor $C_1$ is equal to $\Delta V_1$, or $$t_0 = \frac{\Delta V_1 \times C_1}{I_4}.$$

If this time $t_0$ must be temperature-independent both $\Delta V_1$ and $I_4$ must be temperature-independent. A temperature-independent voltage variation $\Delta V_1$ can be obtained by applying a signal to the input terminal 4, which signal is derived with the aid of a temperature-independent band-gap voltage, and by using for the current source 14 a current source of a type described in the earlier filed Patent Application (PHN. 10.630), Ser. No. 589,244, filed Mar. 13, 1985, now U.S. Pat. No. 4,587,478.

The invention has been described in the context of an embodiment comprising NPN-transistors and two PNP-transistors. It is obvious that the NPN-transistors may be replaced by PNP-transistors and the PNP-transistors by NPN-transistors. Alternatively, field-effect transistors may be employed.

What is claimed is:

1. A circuit for providing an attenuated electric signal and an unattenuated reference signal with related d.c. reference levels comprising:
   first and second transistors connected to provide differential currents from a common current source, one of said transistors connected to receive an input electric signal to be attenuated;
   first and second load impedances connected to each of said transistors for providing a return path for said differential currents through a connected voltage source;
   a voltage divider connected between the junctions of said load impedances and transistors, said voltage divider having a common tap; and
   third and fourth current amplifiers connected to said tap and one of said voltage divider ends, said current amplifiers providing said attenuated signal proportional to said input electric signal and said unattenuated signal proportional to said input electric signal, said attenuated and unattenuated signals having d.c. levels which are substantially equal.

2. The circuit of claim 1 further comprising a delay circuit connected to receive said unattenuated signal; and
   a comparator connected to receive a delayed signal from said delay circuit, and said attenuated signal.

3. The circuit of claim 1 wherein said third and fourth current amplifiers include third and fourth bipolar transistors connected as emitter followers, having control electrodes connected to said voltage divider tap and one voltage divider end.

4. An attenuator circuit as claimed in claim 3, wherein first and second current sources are connected in emitters of the third and fourth transistors, the ratio between the currents supplied by said sources being such that a d.c. level on the tap for the attenuated signal is substantially equal to a d.c. level on the one divider end which carries the unattenuated signal.

5. An attenuator circuit as claimed in claim 4, wherein the ratio between the emitter areas of the third and the fourth transistor is substantially equal to the ratio between the currents in the emitter of the third and fourth transistors.

* * * * *